(12) United States Patent
Katsumata et al.

(10) Patent No.: US 6,977,404 B2
(45) Date of Patent: Dec. 20, 2005

(54) TRENCH DRAM WITH DOUBLE-GATED TRANSISTOR AND METHOD OF MANUFACTURING THE SAME

(75) Inventors: Ryota Katsumata, Yokohama (JP); Hideaki Aochi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/744,818

(22) Filed: Dec. 23, 2003

(65) Prior Publication Data

US 2004/0150037 A1  Aug. 5, 2004

(30) Foreign Application Priority Data

Dec. 27, 2002 (JP) ............................ 2002-381382

(51) Int. Cl.[7] .................. H01L 27/108; H01L 29/76
(52) U.S. Cl. ....................... 257/301; 257/302
(58) Field of Search ................ 257/301–302, 257/311, 330

(56) References Cited

U.S. PATENT DOCUMENTS

| | | | |
|---|---|---|---|
| 6,121,651 A | | 9/2000 | Furukawa et al. |
| 6,140,175 A | * | 10/2000 | Kleinhenz et al. ........... 438/243 |
| 6,552,382 B1 | * | 4/2003 | Wu ............................ 257/305 |
| 6,867,450 B2 | * | 3/2005 | Kito et al. ................... 257/301 |

FOREIGN PATENT DOCUMENTS

| | | |
|---|---|---|
| JP | 2-263473 | 10/1990 |
| JP | 2002-118255 | 4/2002 |

OTHER PUBLICATIONS

D. Hisamoto et al., "*FinFET—A Self-Aligned Double-Gate MOSFET Scalable to 20 nm,*" IEEE Transactions on Electron Devices, vol. 47, No. 12, Dec. 2000, pp. 2320-2325.

* cited by examiner

*Primary Examiner*—Phat X. Cao
*Assistant Examiner*—Theresa T. Doan
(74) *Attorney, Agent, or Firm*—Frommer Lawrence & Haug LLP

(57) ABSTRACT

A projecting semiconductor layer is formed on a major surface of a semiconductor substrate. A channel region of a first conductivity type is formed in part of the semiconductor layer. Source and drain regions of a second conductivity type are formed in the semiconductor layer such that the source and drain regions sandwich the channel region. A pair of first insulating films are formed on a surface of the channel region. A pair of gate electrodes are formed on a surface of the pair of first insulating films. A trench capacitor is provided near the source region in the semiconductor layer. A second insulating film having a greater thickness than the first insulating films is provided between surfaces of the pair of gate electrodes, which are opposed to the surfaces on which the first insulating films are formed, and a trench capacitor formed adjacent to the trench capacitor.

7 Claims, 18 Drawing Sheets

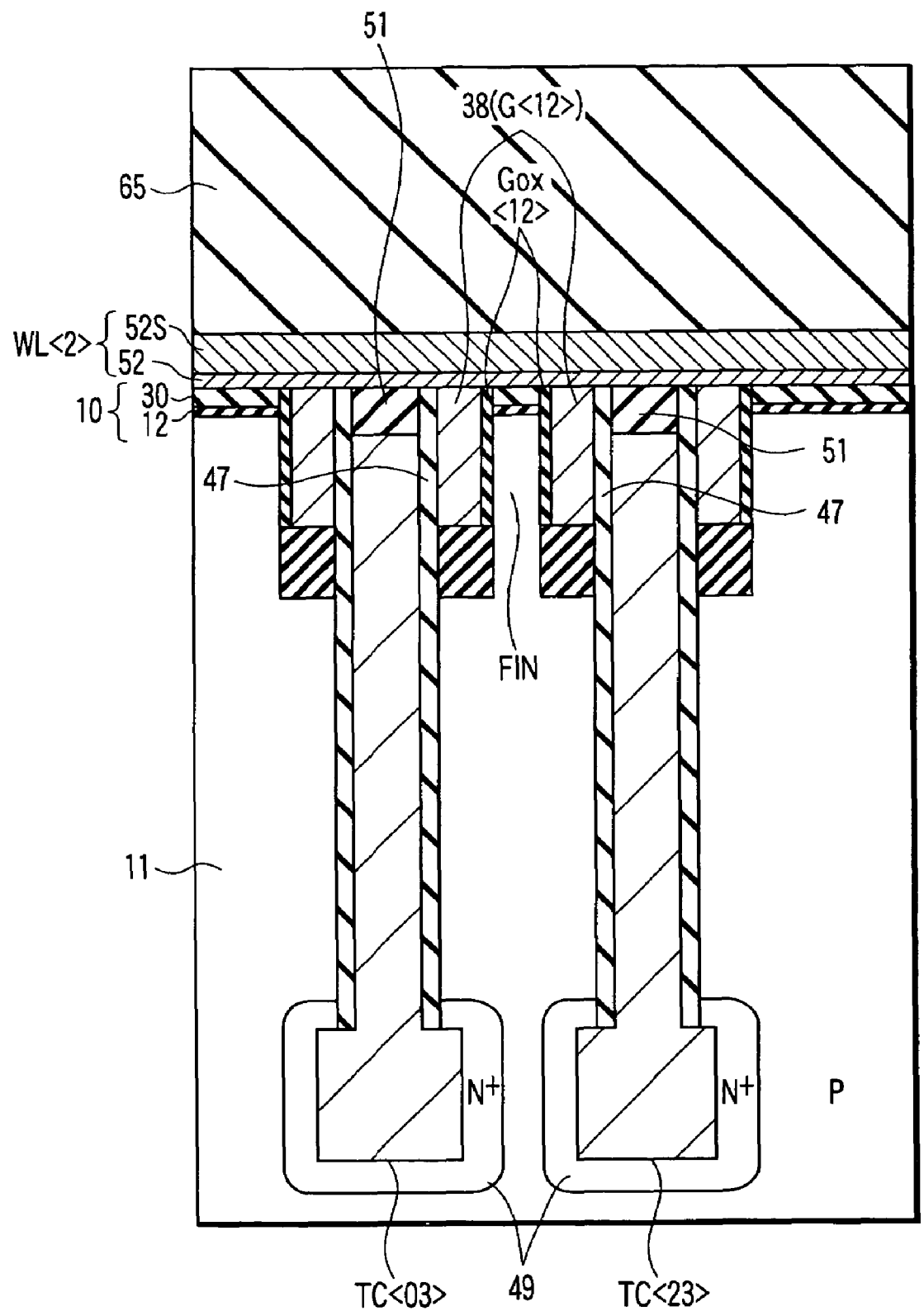
F I G. 1C

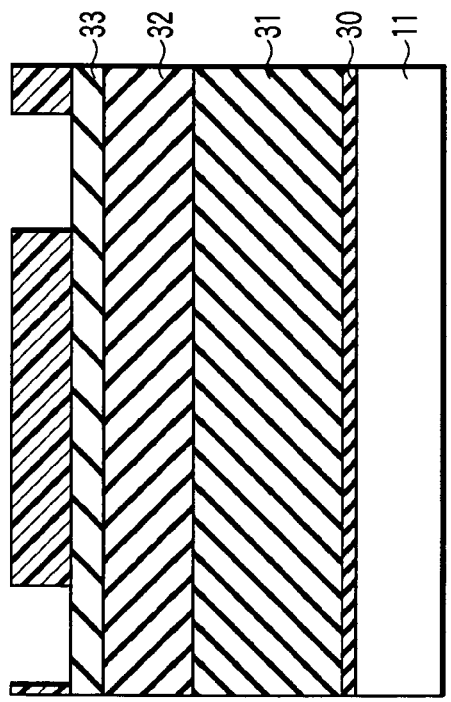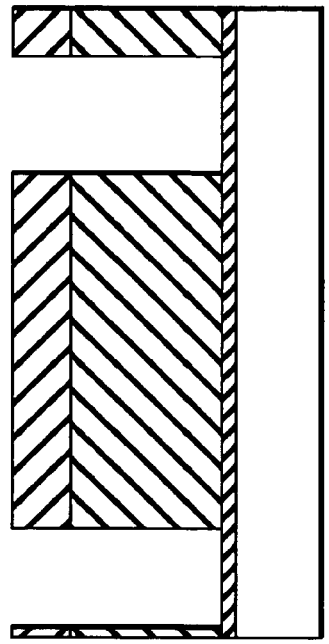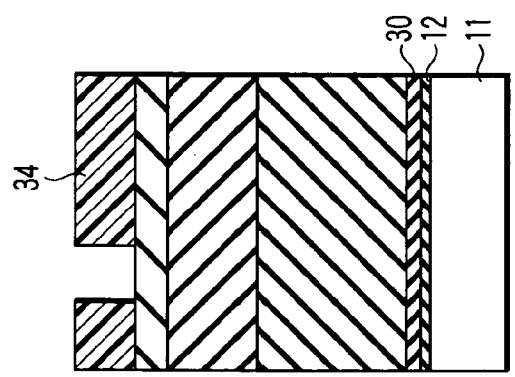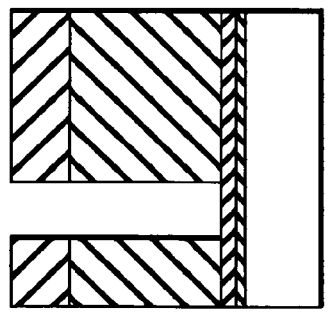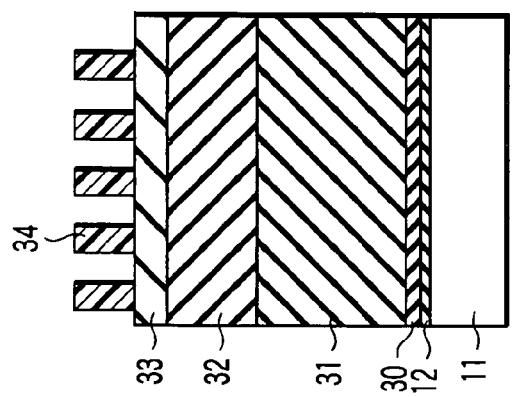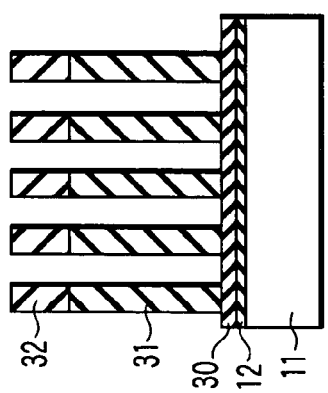
FIG. 2A   FIG. 2B   FIG. 2C
FIG. 3A   FIG. 3B   FIG. 3C

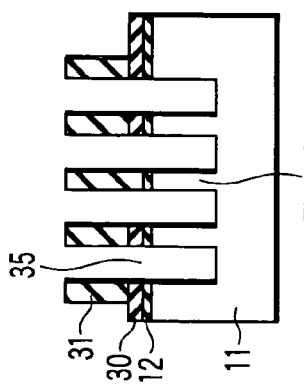
FIG. 4A
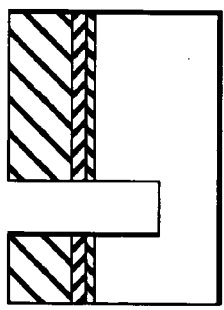
FIG. 4B
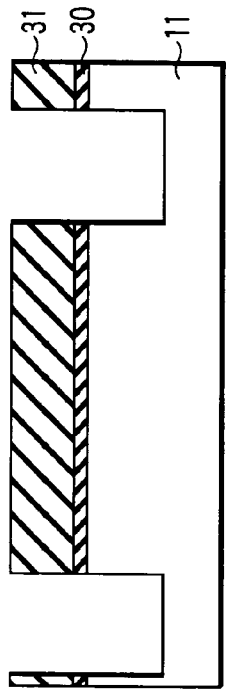
FIG. 4C
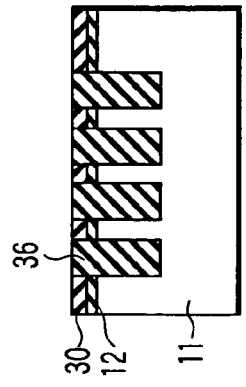
FIG. 5A
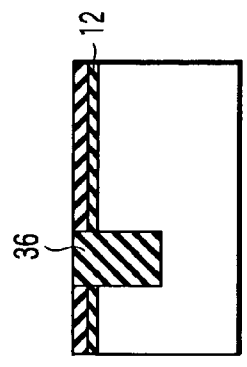
FIG. 5B
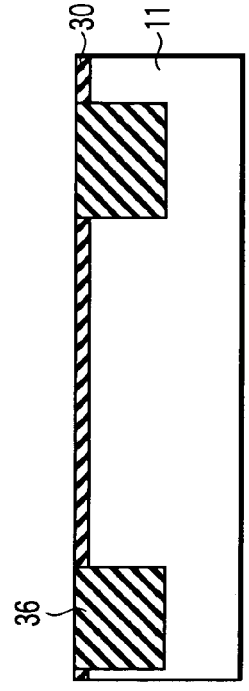
FIG. 5C
FIG. 6A
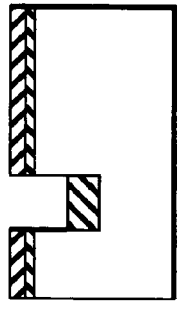
FIG. 6B
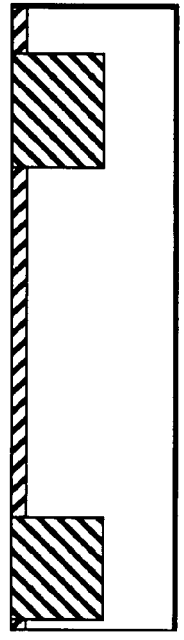
FIG. 6C

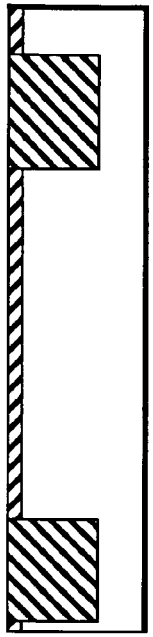
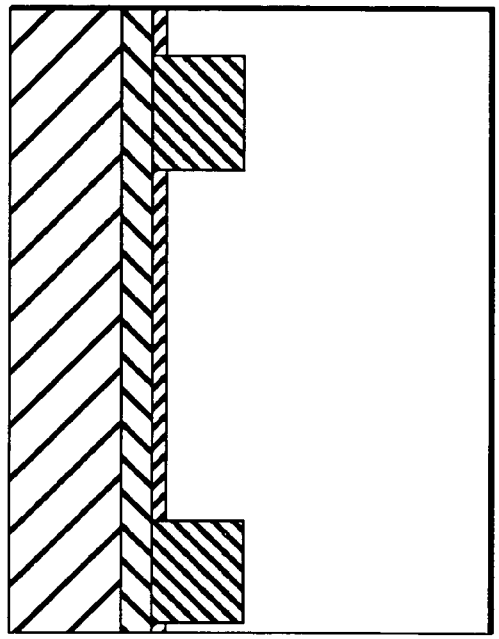
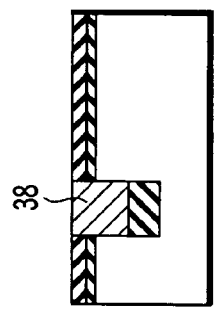
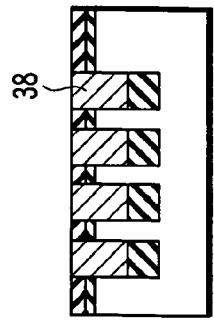
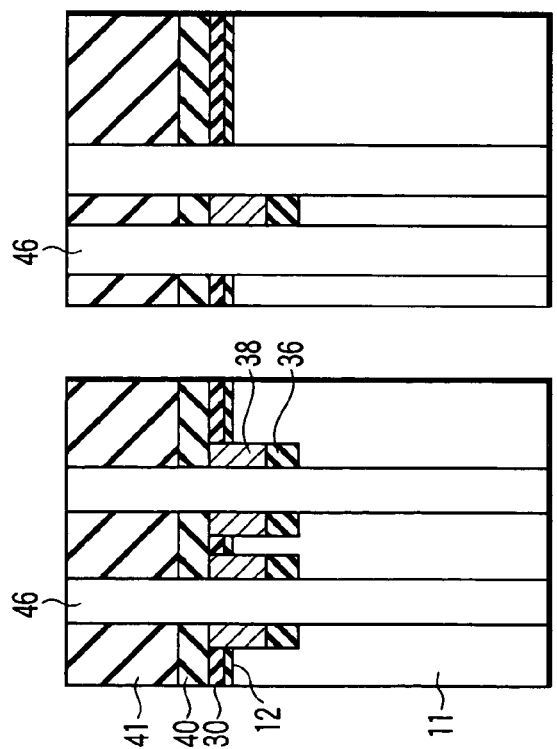
FIG. 7A FIG. 7B FIG. 7C
FIG. 11A FIG. 11B FIG. 11C

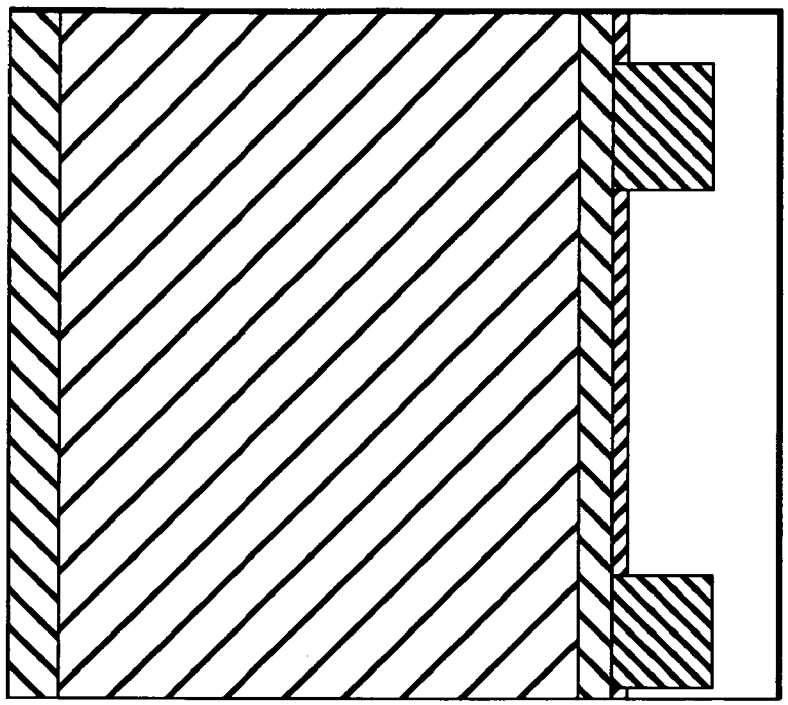
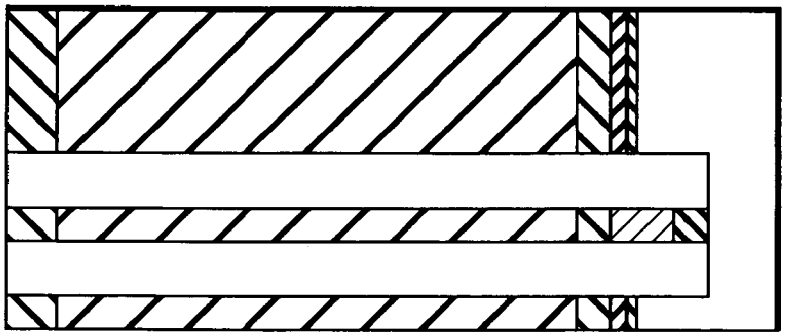
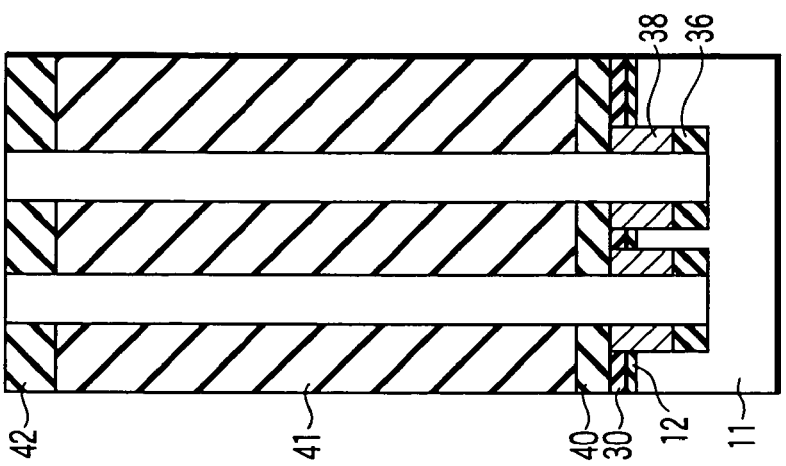
FIG. 10C
FIG. 10B
FIG. 10A

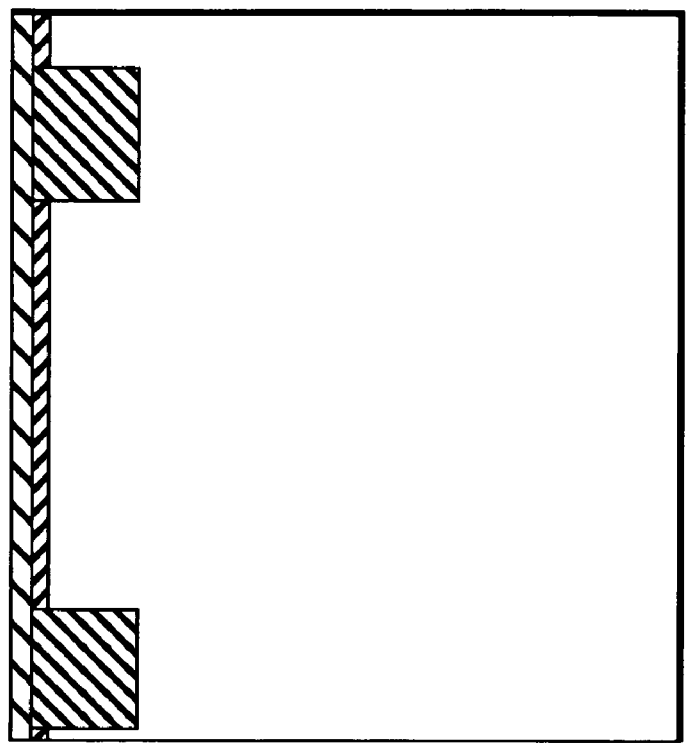
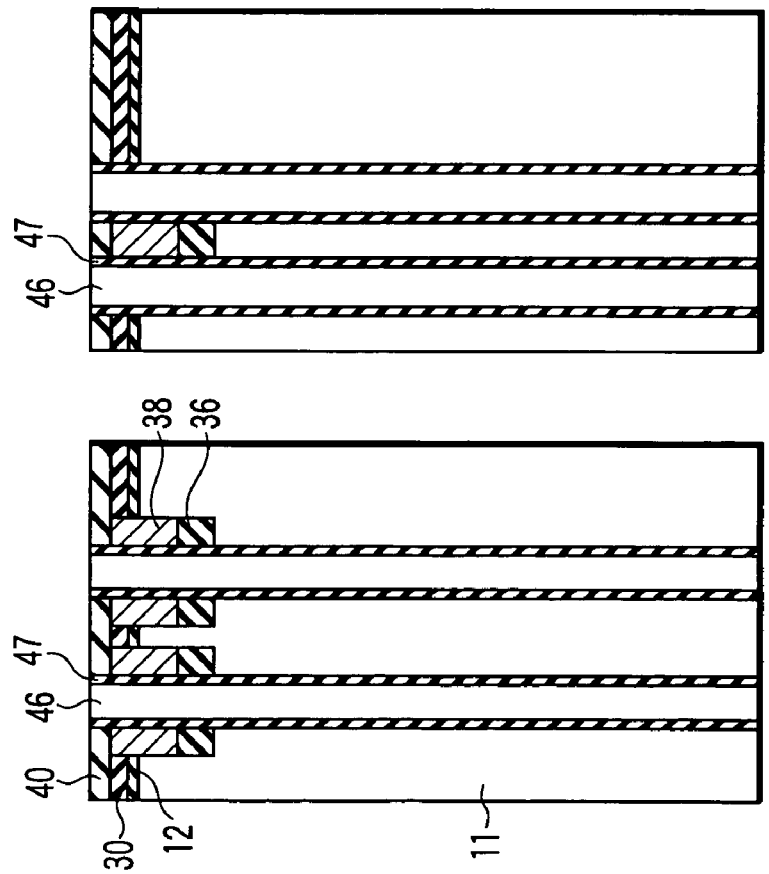
FIG. 12C
FIG. 12B
FIG. 12A

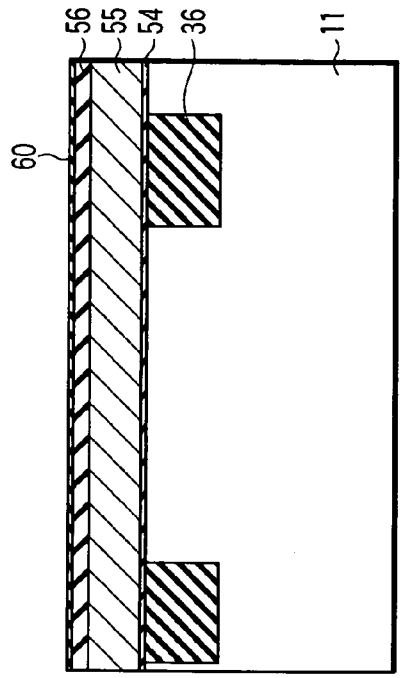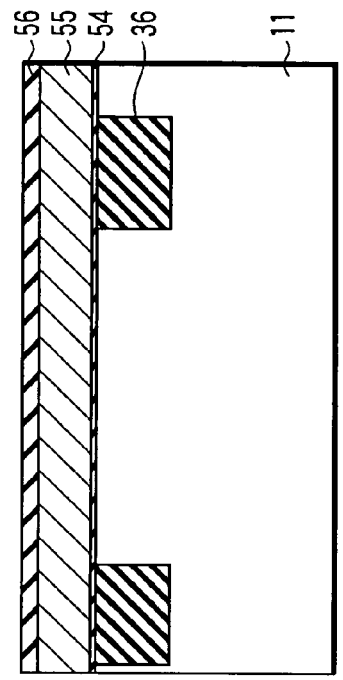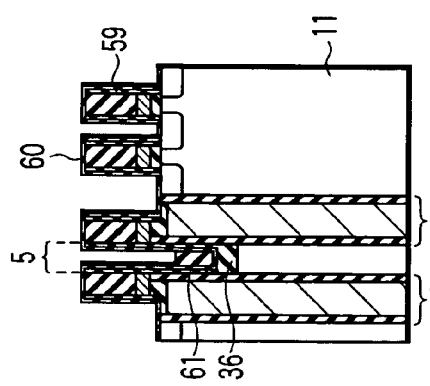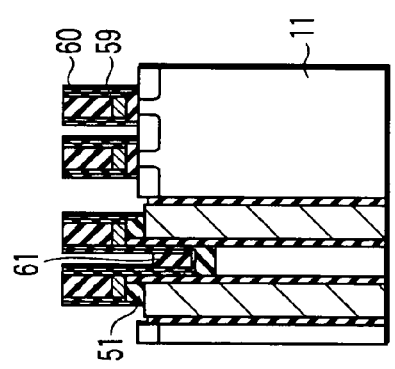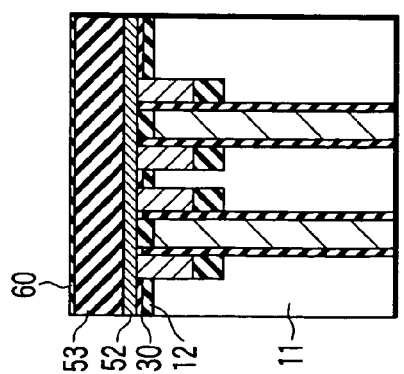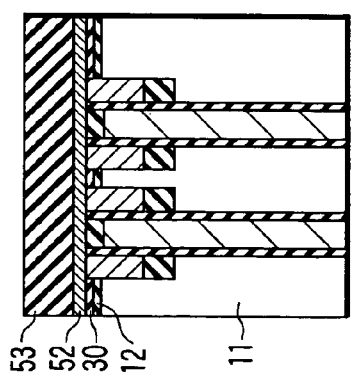

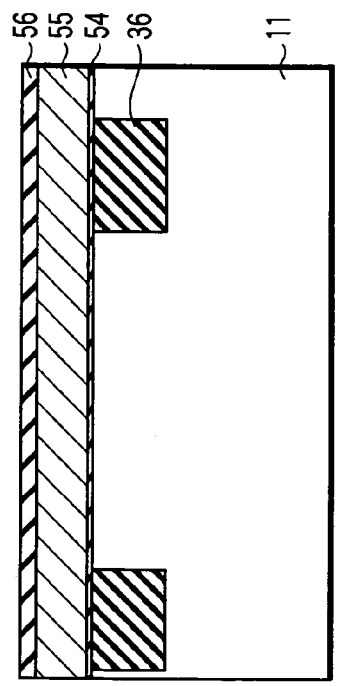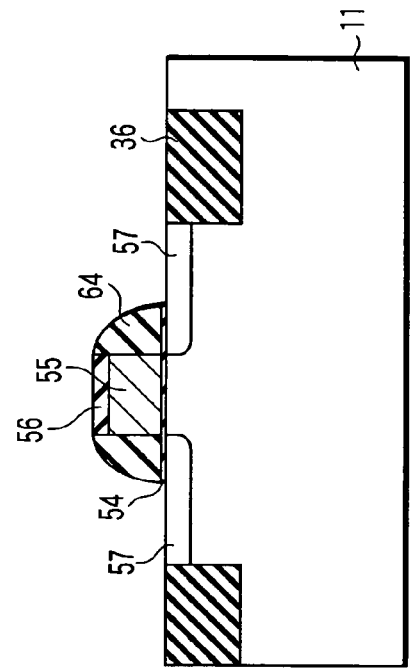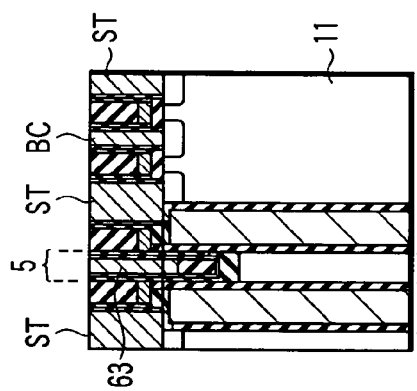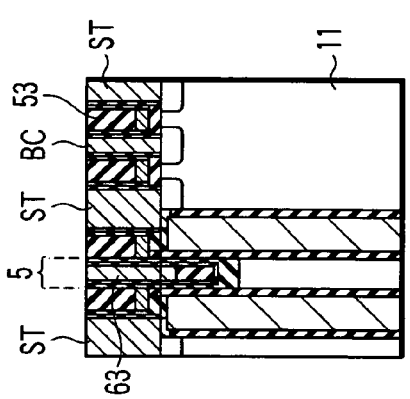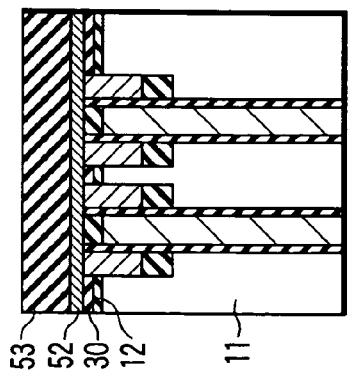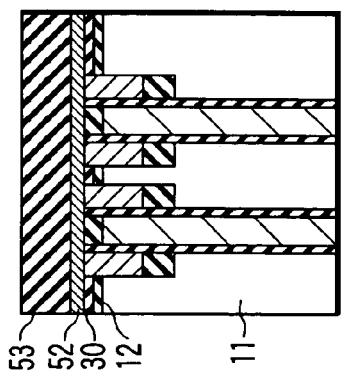
FIG. 20A  FIG. 20B  FIG. 20C
FIG. 21A  FIG. 21B  FIG. 21C

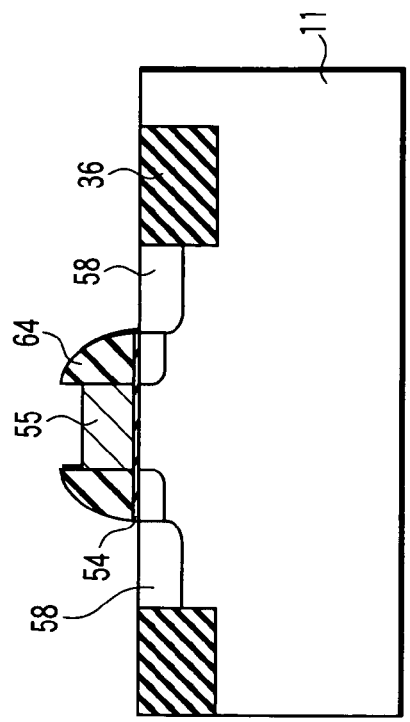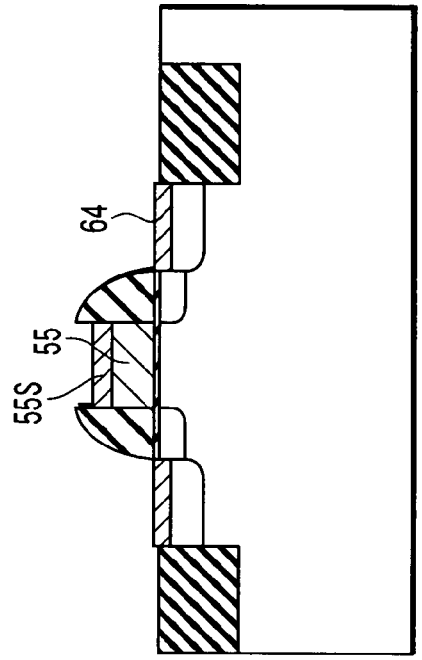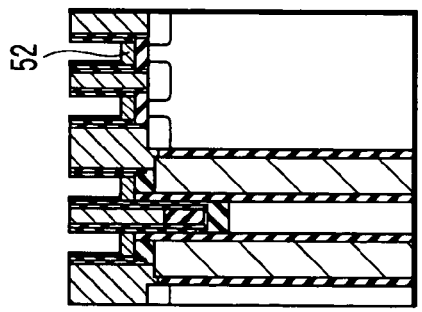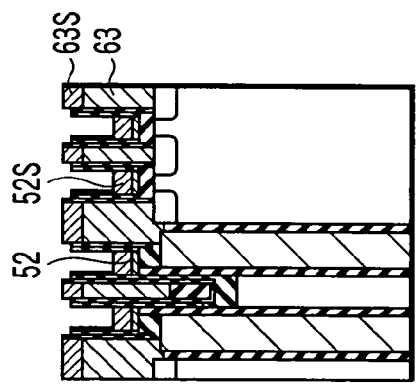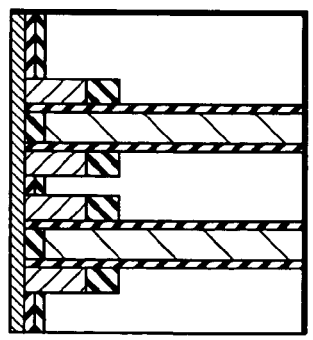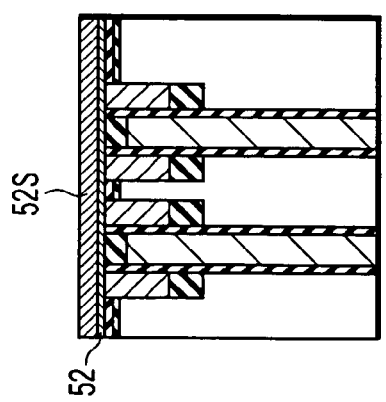

TRENCH DRAM WITH DOUBLE-GATED TRANSISTOR AND METHOD OF MANUFACTURING THE SAME

CROSS-REFERENCE TO RELATED APPLICATIONS

This application is based upon and claims the benefit of priority from the prior Japanese Patent Application No. 2002-381382, filed Dec. 27, 2002, the entire contents of which are incorporated herein by reference.

BACKGROUND OF THE INVENTION

1. Field of the Invention

The present invention relates generally to a semiconductor memory device and a method of manufacturing the same, and more particularly to a trench DRAM with a double-gated transistor and a method of manufacturing the same.

2. Description of the Related Art

In these years, with a trend of accelerated increase in integration density of DRAMs, the cell size has decreased more and more and also the gate length of the cell transistor has decreased more and more. In a DRAM (Dynamic Random Access Memory) cell, in order to maintain retention characteristics of charge accumulated in the capacitor, it is necessary to control a sub-threshold current, a junction leakage current and a GIDL (Gate Induced Drain Leakage) current of the cell transistor. In particular, in order to suppress the sub-threshold current, it is necessary to set the threshold voltage of the cell transistor at a high level.

On the other hand, a decrease in threshold voltage caused by a short-channel effect due to reduction in gate length needs to be corrected by an increase in channel dosage. This results in an increase in junction leakage current and a degradation in electron channel mobility. The former deteriorates the retention characteristics of the DRAM, and the latter prevents improvement in drive-current of the cell transistor in fabricating a high-speed DRAM. In particular, with reduction in cell size, the channel width W, which is an important parameter for determining the drive-current of the cell transistor, decreases and the drive-current further decreases.

As an effective methods for solving the above problems, a double-gated transistor has been proposed (e.g. Jpn. Pat. Appln. KOKAI Publication No. 2002-118255). In addition, double-dated transistors have recently been published by academic societies, etc. (e.g. Dai Hisamoto, et al., IEEE Trans. On Electron Devices Vol. 47, No. 12, P. 2320).

A double-gated transistor is operated with fully-depleted channel. Thus, the threshold voltage is not uniquely determined by the channel dosage, and it greatly depends on the width of the channel between two opposed gates. It is thus possible to reduce the channel dosage that determines the threshold voltage, and the above problems may be solved.

The prior art, however, has the following problems.

A method has been proposed, wherein a double-gate transistor is applied to a complex three-dimensional structure of, e.g. a modern integrated DRAM. However, the structure itself is complex and does not permit simple and easy fabrication.

The prior art mainly relates to transistors for logic circuits applied to ASICs, SRAMs, etc. Thus, no description is given of specific structures of DRAMs or necessary characteristics of transistors. In order to apply the fin-gate type double-gate transistor with a simple and easy structure to the DRAM, the problem of insulation between the cell capacitor and cell transistor is important. If insulation at a location under the active word line and insulation at a location under the passing word line are not sufficient, the reliability of the device deteriorates due to erroneous write/read in the memory cell, and the manufacturing yield lowers. Also, the cell transistor must not be disturbed by the voltage modulation of the passing word line.

BRIEF SUMMARY OF THE INVENTION

A semiconductor memory device according to one aspect of the invention comprises a projecting semiconductor layer formed on a major surface of a semiconductor substrate, a channel region of a first conductivity type formed in part of the projecting semiconductor layer, source and drain regions of a second conductivity type formed in the projecting semiconductor layer such that the source and drain regions sandwich the channel region, a pair of first insulating films formed on a surface of the channel region on opposed side walls of the semiconductor layer, a pair of gate electrodes formed on a surface of the pair of first insulating films on the opposed side walls of the semiconductor layer, a trench capacitor provided near the source region in the semiconductor layer, the trench capacitor having one electrode electrically connected to the source region, and a second insulating film having a greater thickness than the first insulating films, and provided between surfaces of the pair of gate electrodes, which are opposed to the surfaces on which the first insulating films are formed, and a trench capacitor formed adjacent to the trench capacitor.

A method of manufacturing a semiconductor memory device according to one aspect of the invention comprises recess-etching a major surface of a semiconductor substrate, thus forming a plurality of projecting semiconductor layers, burying a first insulating film in the recessed region, etching away an upper part of the first insulating film, and leaving the first insulating film in a lower part of the recessed region, burying a first gate electrode material over the first insulating film in the recessed region, performing etching from a part of the recessed region to a part of the semiconductor layer and to an adjacent recessed region that is located with the semiconductor layer interposed, thus forming a deep trench, forming a collar insulating film on a side wall of the deep trench, forming a trench capacitor in the deep trench, burying a second insulating film on an upper part of the trench capacitor, depositing a second gate electrode material, and patterning the first gate electrode material and the second electrode material at the same time, thus forming a gate electrode.

BRIEF DESCRIPTION OF THE SEVERAL VIEWS OF THE DRAWING

FIG. 1C is a view for describing the semiconductor device according to the embodiment of the invention, FIG. 1C being a cross-sectional view taken along line 1C—1C in FIG. 1A;

FIGS. 2A to 24A are cross-sectional views taken along line 1C—1C in FIG. 1A, illustrating manufacturing steps in succession;

FIGS. 2B to 24B are cross-sectional views taken along line 1B—1B in FIG. 1A, illustrating manufacturing steps in succession; and FIGS. 2C to 24C are cross-sectional views illustrating manufacturing steps in succession of peripheral circuits, such as address buffers, provided in the vicinity of the memory cell array.

DETAILED DESCRIPTION OF THE INVENTION

[First Embodiment]

Figure 1A:
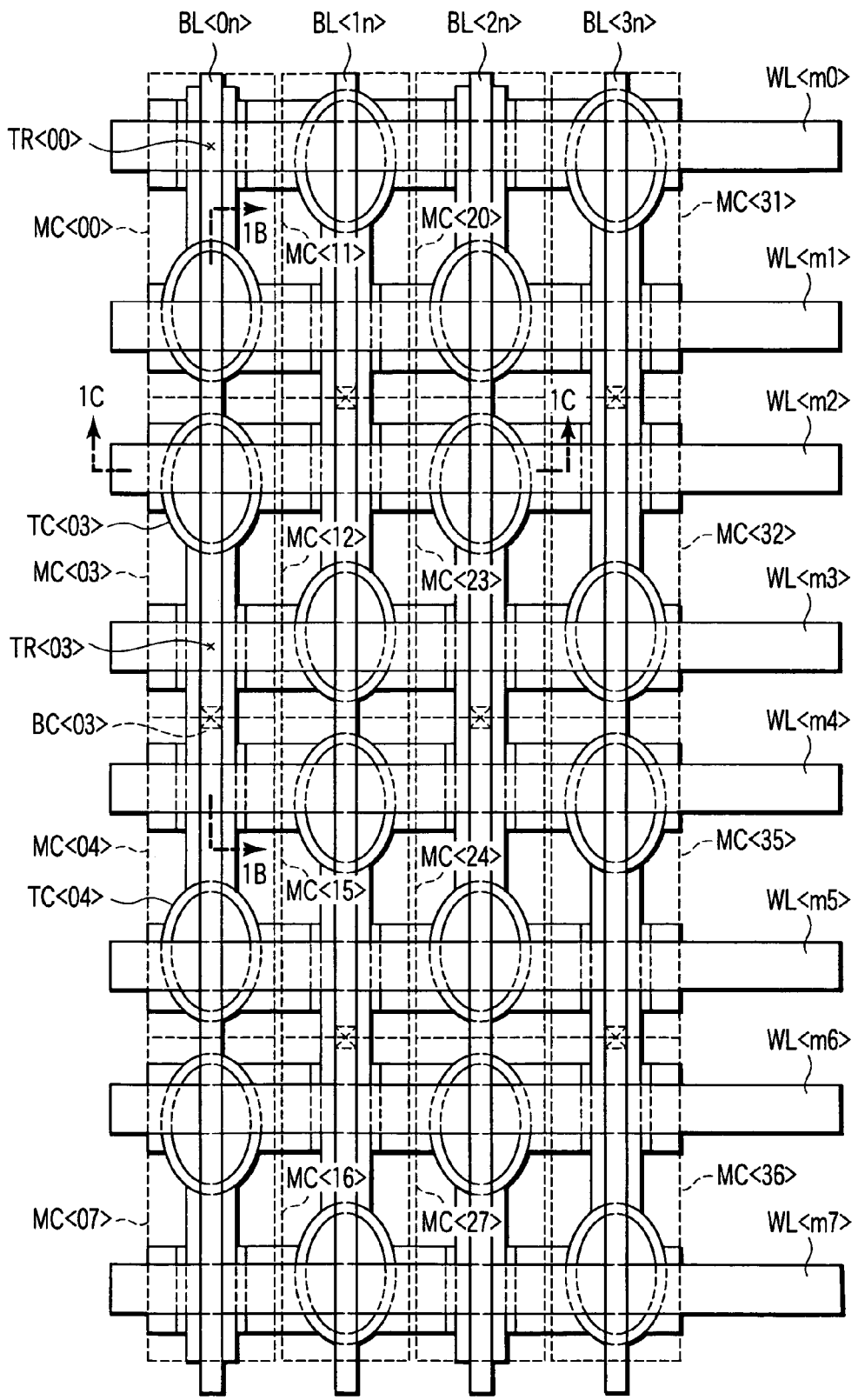
FIG. 1A is a view for describing a semiconductor device according to an embodiment of the invention, FIG. 1A being a plan view schematically showing a memory cell array of DRAM cells to which fin-gate type double-gate transistors are applied.
Figure 1B:
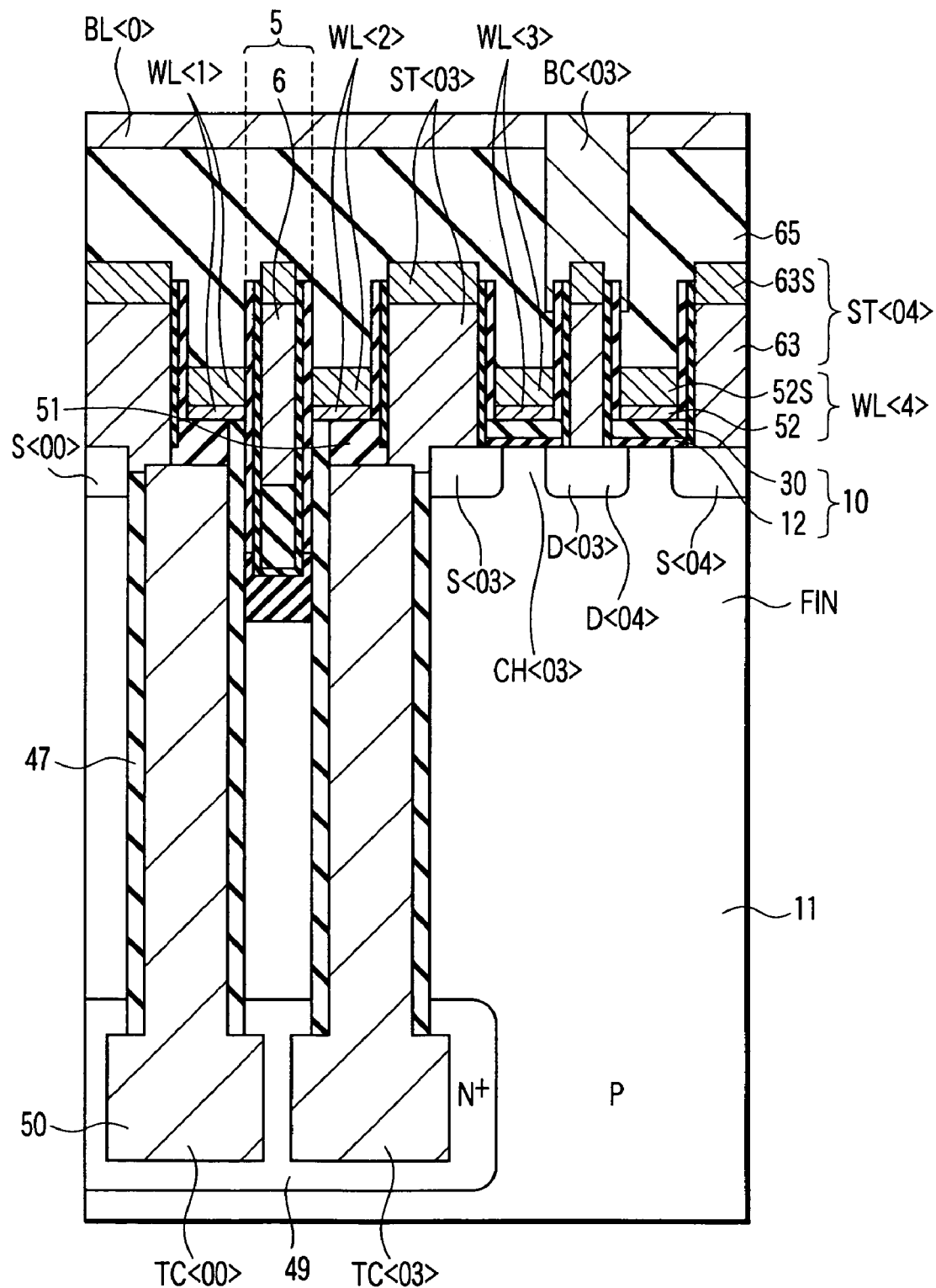
FIG. 1B is a view for describing the semiconductor device according to the embodiment of the invention, FIG. 1B being a cross-sectional view taken along line 1B—1B in FIG. 1A.
Figure 1D:
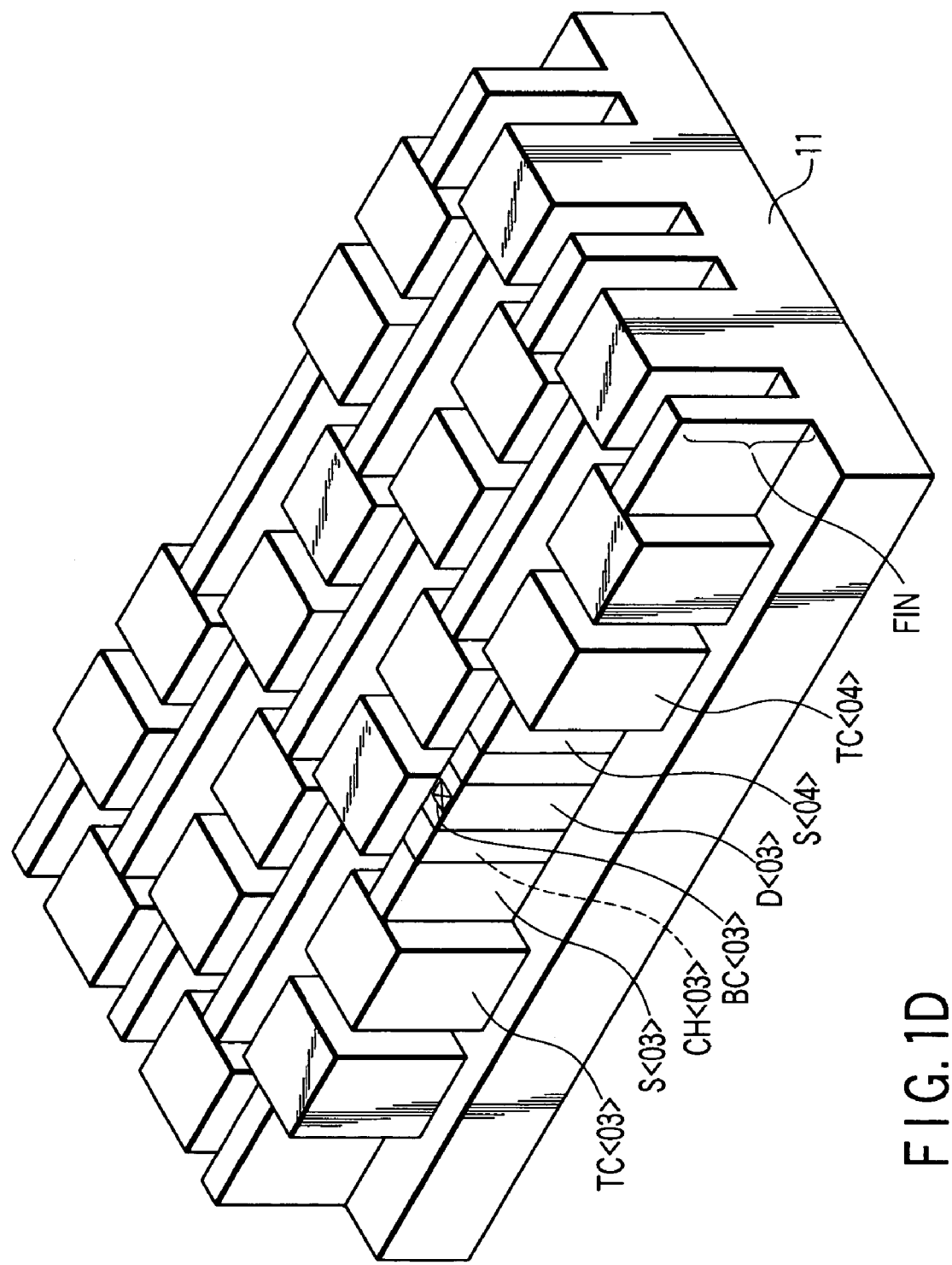
FIG. 1D is a view for describing the semiconductor device according to the embodiment of the invention, FIG. 1D being a perspective view schematically showing a main part of the memory cell array.

FIGS. 1A to 1D are views for describing a semiconductor device and a dynamic semiconductor memory device according to an embodiment of the invention. FIGS. 1A to 1D show a DRAM by way of example. FIG. 1A is a plan view schematically showing a memory cell array of DRAM cells to which the fin-gate type double-gate transistors and trench capacitors are applied. FIG. 1B is a cross-sectional view taken along line 1B—1B in FIG. 1A. FIG. 1C is a cross-sectional view taken along line 1C—1C in FIG. 1A. FIG. 1D is a perspective view schematically showing a main part of the memory cell array shown in FIG. 1A.

In the Figures, <mn> (m, n=a positive integer) corresponds to <column & row> in each memory cell.

An example of the pattern of the memory cell array will now be described with reference to FIG. 1A. MC<00> to MC<36> indicated by broken lines are 1-bit memory cells. The memory cells MC (MC<00> to MC<36>) are provided at intersections between bit lines BL (BL<0> to BL<3>) and word lines WL (WL<0> to WL<7>).

Each memory cell MC comprises a fin-gate type double-gate transistor TR (TR<00> to TR<36>) and a trench capacitor TC (TC<00> to TC<36>). A source region of each transistor TR is connected to one of the electrodes of the trench capacitor TC, and a drain region thereof is commonly connected to a drain region of the transistor TR in the adjacent memory cell MC, whereby a pair of memory cells MC are formed. The drain region of each transistor TR is connected to a bit line BL via a bit line contact (connection portion) BC. The paired memory cells MC are arranged such that the transistor TR and trench capacitor TC are alternately disposed along the associated word line WL. For example, if attention is paid to the word line WL<m0>, the components are arranged in the following order: the transistor TR<00> of memory cell MC<00>, the trench capacitor TC<11> of memory cell MC<11>, the transistor TR<20> of memory cell MC<20>, and the trench capacitor TC<31> of memory cell MC<31>. In this manner, a pair of double-gate transistors and a pair of trench capacitors are alternately arranged in a staggered fashion. Thereby, the area occupied by the pattern can be reduced.

Next, the three-dimensional structure of the memory cell MC<03> and memory cell MC<04> in FIG. 1A, for instance, will be described referring to the cross-sectional views of FIGS. 1B and 1C and the perspective view of FIG. 1D.

A P-type silicon substrate 11 is provided with a projecting semiconductor region (called "pillar" or "fin", hereinafter referred to as "pillar") FIN. The pillar FIN is formed by processing a surface portion of the silicon substrate 11 in a projecting shape. The height of the pillar FIN is, e.g. 0.3 to 1.0 $\mu$m, but it may be less than 0.3 $\mu$m. A channel region CH<03> is formed on both side walls of the pillar FIN. Boron (B), for instance, is ion-implanted in the channel region CH<03> for adjusting the threshold voltage.

As is shown in FIG. 1C, a gate insulating film $G_{OX}$<12> is formed on the surface of a channel region CH<03> (not shown). The thickness of the gate insulating film $G_{OX}$<12> is, e.g. 5 nm. In addition, as shown in FIG. 1B, each source region S is connected to one of the electrodes (storage electrode 50) of the trench capacitor TC via a strap electrode ST. Each strap electrode ST has a stacked structure comprising a polysilicon layer 63 and a high-melting-point metal silicide layer 63S. For example, the strap electrode ST<03> of memory cell MC<03> is put in contact with parts of the upper surface and side wall of the source region S<03> formed on the side surface of the pillar FIN. Thus, the source region S<03> and the storage electrode 50 of trench capacitor TC<03> are electrically connected. Alternatively, the source region ST<03> and strap electrode ST<03> may be connected such that only the upper surface or the side wall of the source region S<03> contacts the strap electrode ST<03>. The reason is that it should suffice if sufficient electrical connection is established between the source region S and strap electrode ST. The resistance value between the source region S and trench capacitor TC can be decreased by connecting the source region S and the storage electrode 50 of trench capacitor TC in this manner.

The trench capacitor TC comprises the storage electrode 50 and plate electrode 49, which are formed via a capacitor insulating film (not shown). The storage electrode 50 is formed of, e.g. polysilicon buried in a trench, and the plate electrode 49 is formed of, e.g. an N$^+$ type region that is formed by diffusing arsenic (As) in the substrate 11.

A word line WL is formed on the upper surface of the pillar FIN such that an insulating film 10 having a thickness of, e.g. about 0.1 $\mu$m or less, is interposed therebetween. For example, a word line (active word line) WL<3> is formed via the insulating film 10 formed on the channel region of the memory cell MC<03>. The active word line WL, in this example, is a word line for switching the transistor provided immediately below. The active word line WL comprises a polysilicon layer 52 and a high-melting-point metal silicide layer 52S. The insulating film 10 comprises, for example, a silicon oxide film 12 with a thickness of 0.002 $\mu$m and a silicon nitride film 30 with a thickness of 0.07 $\mu$m.

A buried insulating film 51 is formed on the upper surface of the trench capacitor TC. A collar insulating film 47 is formed along wall of the upper part of the trench capacitor TC. The thickness of the buried insulating film 51 is 0.03 $\mu$m or more, which is greater than the thickness of the gate insulating film $G_{OX}$. A word line (passing word line) WL of the adjacent memory cell is formed on each buried insulating film 51. For example, a passing word line WL<2> is formed on the buried insulating film 51 formed on the upper surface of the trench capacitor TC<03>. The passing word line WL merely passes over the trench capacitor TC<03> and has no switching function for the memory cell MC<03>. In this manner, the word lines WL are provided such that active word lines and passing word lines are alternately arranged.

An isolation portion 6 is formed at an upper part of a device isolation region 5 between the trench capacitors TC of memory cells MC formed along the bit line BL.

As is shown in FIG. 1B, gate electrodes G of polysilicon are formed on both side walls of the pillar FIN so as to sandwich the pillar FIN via the gate insulating film $G_{OX}$. In addition, a word line WL comprising a polysilicon layer 52 and a silicided-polysilicon layer 52S is formed in contact with the upper surface of the gate electrode G. Furthermore, adjacent to the gate electrode G, trench capacitors TC are formed along the word line WL. For example, a trench capacitor TC<03> and a trench capacitor TC<23> are formed along the word line WL<2> adjacent to the gate electrode G<12>. A collar insulating film 47 is formed on an inner wall of the upper part of the trench capacitor TC. A buried insulating film 51 is formed on the upper surface of the trench capacitor TC. Furthermore, a word line WL is formed in contact with the collar insulating film 47 and buried insulating film 51. Accordingly, the gate electrode G is sandwiched between the gate insulating film $G_{OX}$ and collar insulating film 47. The thickness of the collar insulating film 47 is made greater than that of the gate insulating film $G_{OX}$.

An example of the basic operation of each memory cell MC will now be described, referring to the memory cell MC<03> by way of example. In the following description of the example of the basic operation, attention will be paid to the variation in voltage of the bit line BL<0> in the read/write operation mode.

To begin with, the data read-out operation will be described. The bit line BL<0> is selected and precharged. The bit line BL<0> is thus activated. The precharge level of the bit line BL<0> is set at ½ (VDD/2) of the power supply voltage VDD that drives the sense amplifier for sensing the signal from, e.g. the bit line BL<0>.

Then, the word line WL for data read-out is selected. A positive potential is applied to the selected word line WL from a word line driver in a row decoder (not shown). For example, if the word line WL<3> is selected, the transistors with gate electrodes connected to the word line WL<3> are turned on. In FIG. 1A, the gate electrode G<3> connected to the word line WL<3> is selected, and the transistor TR<03> is turned on.

Thereby, the bit line BL<0> at the precharge level is electrically connected to the storage electrode of trench capacitor TC<03> of memory cell MC<03>.

At this time, if charge is accumulated in the trench capacitor TC<03> of memory cell MC<03>, charge is released to the bit line BL<0> from the trench capacitor TC<03> of memory cell MC<03>. As a result, the potential of the bit line BL<0> becomes higher than that of other bit lines set at the precharge level (VDD/2). On the other hand, if no charge is accumulated in the trench capacitor TC<03>, charge is supplied from the bit line BL<0> to the trench capacitor TC<03> and is released. Thereby, the potential of the bit line BL<0> becomes lower than that of other bit lines set at the precharge level (VDD/2). The potential difference is sensed and amplified by the sense amplifier connected thereto, whereby "1" data or "0" data is read out. In this case, in accordance with the read-out "1" data or "0" data, "1" data or "0" data is rewritten in the trench capacitor TC<03> of memory cell MC<03> ("data refresh").

Next, the data write operation will be described. To start with, a VDD level or 0 V is applied from the sense amplifier to the bit line BL<0> in accordance with write data "1" or "0". If the word line WL<3> is selected, the transistor TR<03> is turned on and the bit line BL<0> is electrically connected to the storage electrode 50 of trench capacitor TC<03>.

Charge is accumulated in the trench capacitor TC<03> from the bit line BL<03> via the transistor TR<03>, or charge is released from the trench capacitor TC<03>. Thus, the write operation is performed.

The same operation is performed for other memory cells MC.

According to the above structure, the following advantages can be obtained.

Since the buried insulating film 51 is thicker than the gate insulating film $G_{OX}$, the possibility of malfunction can be lowered and the reliability is enhanced.

As has been described above, when the read/write operation is performed, current is let to flow to the bit line BL and word line WL, and the potential of the bit line BL is detected. The potential of the bit line BL varies depending on whether the charge is accumulated in the trench capacitor TC or released therefrom.

However, in the present embodiment, as described above, the buried insulating film 51 completely covers the upper surface of the trench capacitor TC and has a thickness enough to achieve electrical insulation. For example, in FIG. 1C, electrical insulation between the word line WL<2> and the trench capacitor TC<03>, TC<23> can sufficiently be maintained.

The gate electrode G is sandwiched between the gate insulating film $G_{OX}$ and the thick collar insulating film 47. Thus, malfunction of, for example, the trench capacitors TC<03> and TC<23> that are adjacent as shown in FIG. 1B, can be prevented. In other words, when a switching operation is performed by the gate electrodes formed on both side walls of the pillar FIN, if electrical insulation between the adjacent trench capacitors is not sufficient, malfunction may be caused due to similar operations. However, the thick collar insulating film 47 ensures sufficient insulation.

Since the source region and trench capacitor TC are connected via the strap electrode ST, the resistance value between the source region S and trench capacitor TC can be reduced.

Since each of the word line WL, strap electrode ST and bit line contact BC has the double-layer structure comprising the polysilicon layer and high-melting-point metal silicide layer, the silicide layer can reduce the resistance value.

A method of fabricating the semiconductor device according to the embodiment of the invention will now be described. Specifically, a method of fabricating the memory cell having the fin-gate type double-gate transistor and trench capacitor shown in FIGS. 1A to 1D will be described by way of example. In this example, the memory cell array and its peripheral circuit, or a logic circuit or an arithmetic circuit different from the memory, are fabricated through a series of steps.

FIGS. 2A to 24A are cross-sectional views taken along line 1B—1B in FIG. 1A, illustrating manufacturing steps in succession. FIGS. 2B to 24B are cross-sectional views taken along line 1C—1C in FIG. 1A, illustrating manufacturing steps in succession. FIGS. 2C to 24C are cross-sectional views illustrating manufacturing steps in succession of a peripheral circuit, such as an address buffer, a decoder, a sense amplifier or an input/output buffer, which is provided in the vicinity of the memory cell array (or a logic circuit or an arithmetic circuit different from the memory).

To start with, a silicon oxide film 12 with a thickness of about 2 nm is formed by, e.g. thermal oxidation, on a major surface of a P-type silicon substrate 11. The silicon oxide film 12 may be an oxide film formed by a chemical process with a different composition. A silicon nitride film 30 with a thickness of, e.g. 70 nm is deposited on the silicon oxide film 12. A TEOS-SiO$_2$ film 31 with a thickness of, e.g. about 550 nm, is formed on the silicon nitride film 30 by CVD (Chemical Vapor Deposition) using TEOS (Tetra Ethyl Ortho Silicate) as a reaction gas. A hard mask film 32 with a thickness of, e.g. 300 nm, which is comprised essentially of an insulating film, is formed on the TEOS-SiO$_2$ film 31. An SOG (Spin on Glass) film 33 with a thickness of, e.g. 10 nm, is deposited on the hard mask film 32. The hard mask film 32 and SOG film 33 serve to exactly form a trench in the TEOS-SiO$_2$ film 31, as will be described later. A photoresist 34 is coated on the SOG film 33, and is subjected to exposure and development. Thus, the photoresist 34 is patterned to form a device isolation region (STI: Shallow Trench Isolation). The width of the device isolation region is, e.g. about 90 nm to 110 nm, and the device isolation regions are arranged at intervals of 90 nm to 100 nm (FIGS. 2A and 2B).

The peripheral circuit is formed through the same steps as the memory cell array. A silicon nitride film 30, a TEOS-SiO$_2$ film 31 and an SOG film 33 are successively deposited on the silicon substrate 11. A photoresist 34 is coated on the SOG film 33, and the photoresist 34 is patterned (FIG. 2C).

Using the photoresist 34 as a mask, the SOG film 33, hard mask film 32 and TEOS-SiO$_2$ film 31 are etched by, e.g. RIE (Reactive Ion Etching). Then, the SOG film 33 and photoresist 34 are removed (FIGS. 3A, 3B and 3C).

Then, using the remaining hard mask film 32 and TEOS-SiO$_2$ film 31 as a mask, a trench 35 with a width of 30 nm to 130 nm and a depth of about 250 nm is formed by, e.g. RIE, in the silicon nitride film 30, silicon oxide film 12 and silicon substrate 11. Through the steps of forming the trench 35, a projecting semiconductor region (width: 20 nm to 110 nm), which will become, e.g. a pillar FIN<12> of memory cell MC<12>, is formed on the major surface of silicon substrate 11 (FIGS. 4A and 4B).

As regards the peripheral circuit, a trench is formed by, e.g. RIE, in STI region formation portions of the silicon nitride film 30 and silicon substrate 11 through the same steps at the same time (FIG. 4C).

An oxide film (not shown) is formed by, e.g. thermal oxidation, on an inner wall of the trench. Further, SiO$_2$ is buried by, e.g. CVD, and then the surface is flattened by CMP (Chemical Mechanical Polishing). Through the above steps, an STI region 36 is formed in the trench 35 (FIGS. 5A and 5B).

As regards the peripheral circuit, an STI region 36 is formed in the trench by the same steps (FIG. 5C).

In the above steps up to the formation of the STI regions 36 of the memory cell array and peripheral circuit, the masks can be shared. Compared to the case where the STI region 36 is independently formed for the memory cell array and peripheral circuit, the manufacturing steps can be simplified and the manufacturing cost can be reduced.

Next, the peripheral circuit is masked and the STI region 36 of the memory cell array is etched back by, e.g. wet etching, by a depth of about 150 nm. At this time, the thickness of the STI region 36 left on the bottom of the trench is about 30 nm (FIGS. 6A, 6B and 6C).

Thereafter, by means of, e.g. ion implantation, phosphorus (P) is implanted twice in different oblique directions in the side walls of the silicon substrate 11 at the upper part of the STI region in the memory cell array. This implantation step can be carried out before recessing the STI region 36. In such a case, ions are vertically implanted, and then a gate insulating film G$_{OX}$ with a thickness of about 5 nm is formed by, e.g. thermal oxidation (not shown). Further, the resultant is nitrided in a nitrogen atmosphere or a plasma atmosphere and then annealed. Thereafter, a polysilicon layer 38, which will become the gate electrode, is deposited (FIGS. 7A, 7B and 7C).

Figure 8C:
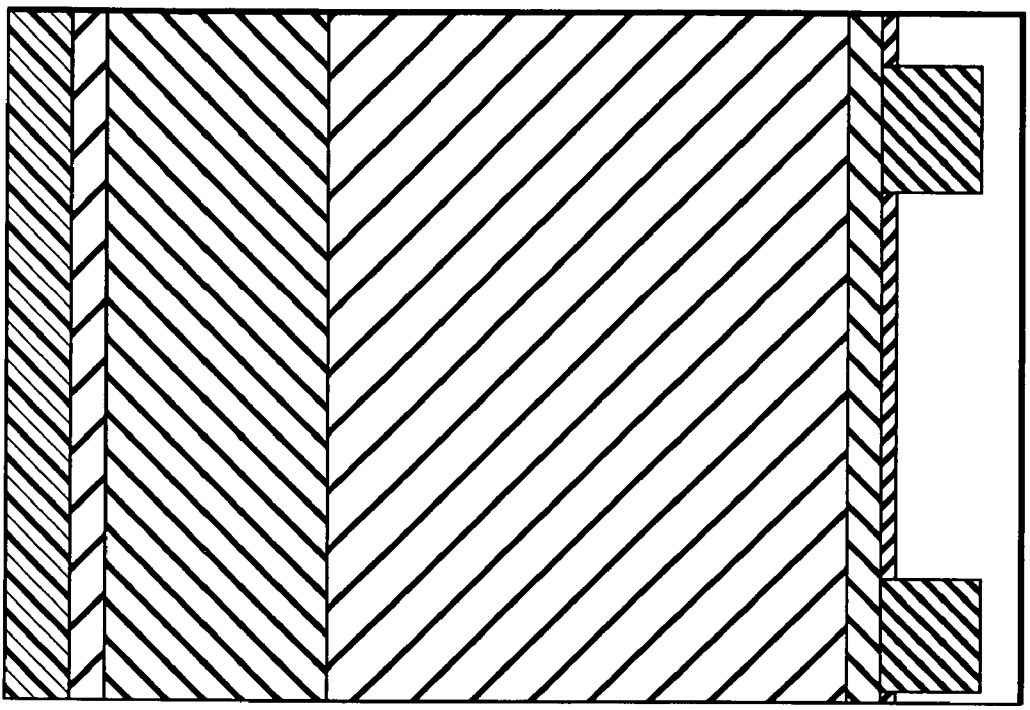
Figure 8B:
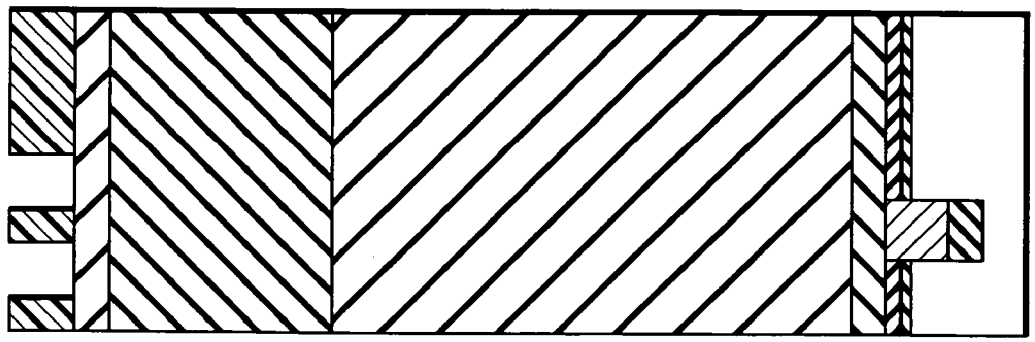
Figure 8A:
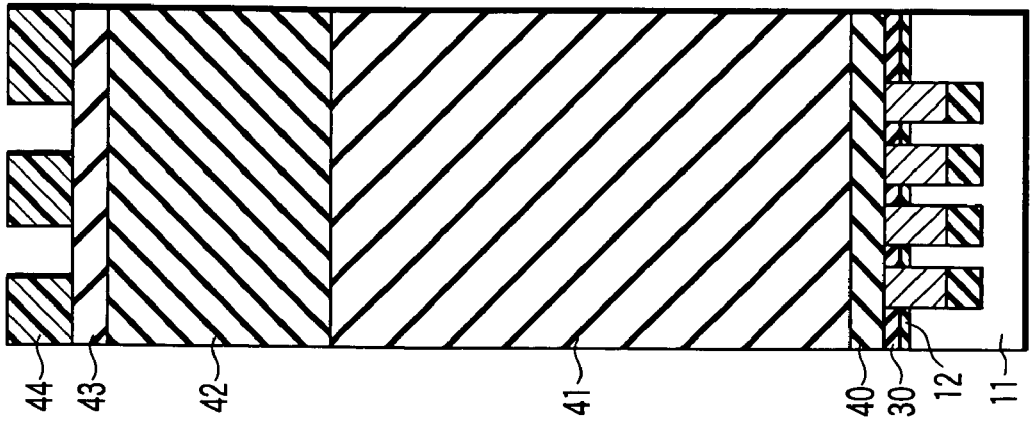

Subsequently, an oxide film is deposited on the entire surface of the substrate 11, for example, in a low-pressure atmosphere in which O$_2$ and H$_2$ are burnt, or in an ozone-containing atmosphere (not shown). Further, a silicon nitride film 40 with a thickness of about 100 nm, a BSG film 41 with a thickness of about 1600 nm serving as a mask material, a hard mask film 42 with a thickness of about 700 nm and an SOG film 43 with a thickness of about 10 nm are deposited in succession. A photoresist 44 is coated on the SOG film 43, and the photoresist 44 is subjected to exposure and development. Thus, a mask patterning for forming a deep trench is formed. The hard mask film 42 and SOG film 43 are deposited in order to exactly etch the BSG film 41 (FIGS. 8A, 8B and 8C).

Figure 9A:
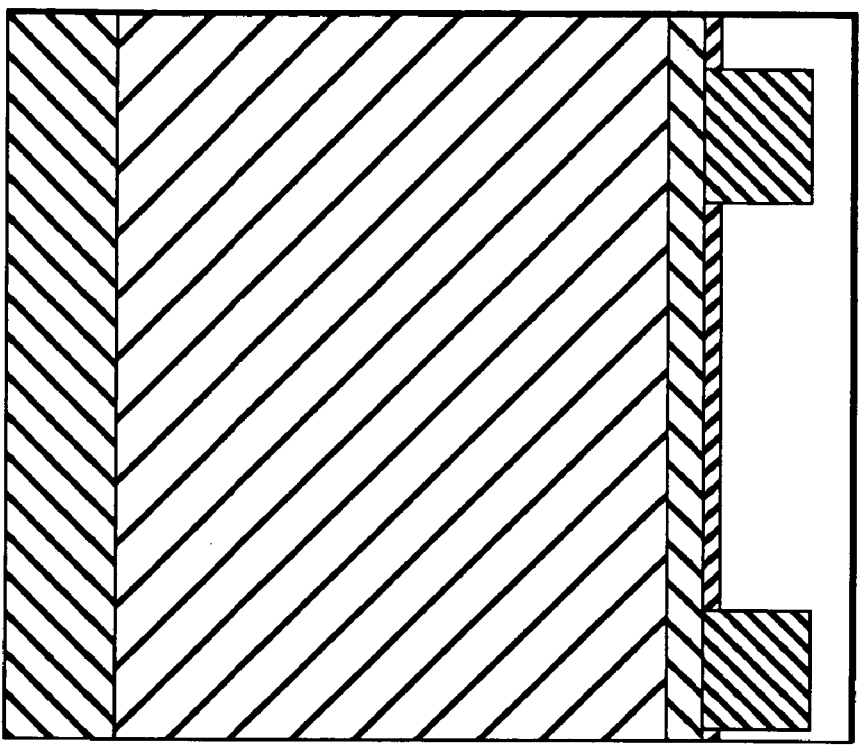
Figure 9B:
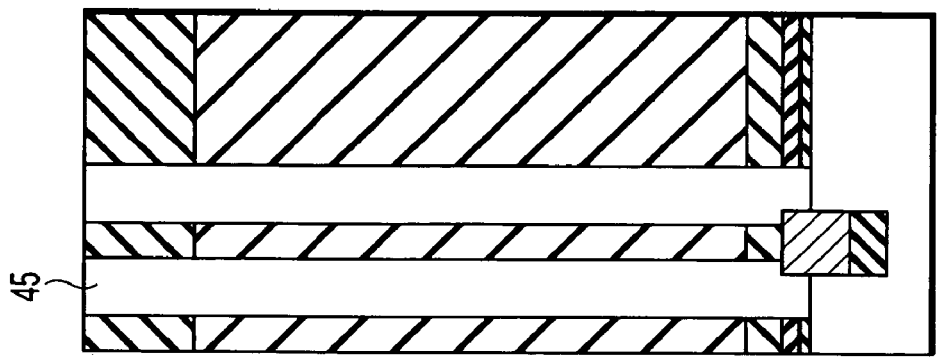
Figure 9C:
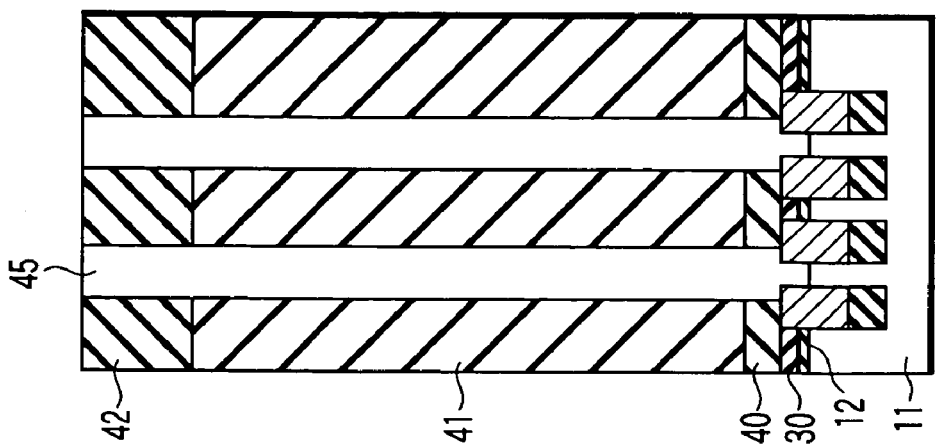

Using the photoresist 44 as a mask, the SOG film 43, hard mask film 42, BSG film 41, silicon nitride film 40, silicon nitride film 30 and silicon oxide film 12 are successively etched by, e.g. RIE. Thereby, a trench 45 serving as a mask for forming the deep trench is formed. The photoresist 44 and SOG film 43 are removed. In this step, by virtue of an oxide film (not shown) formed between the silicon nitride 30 and the silicon nitride film, only the silicon nitride film 40 can be selectively removed (FIGS. 9A, 9B and 9C).

Then, the polysilicon layer 38 and STI region 36 are etched by, e.g. a low-selection-ratio etching method (FIGS. 10A, 10B and 10C).

Subsequently, the silicon substrate 11 is etched by, e.g. RIE, and a deep trench 46 with a depth of, e.g. about 6 $\mu$m is formed. Thereafter, post-cleaning is performed (FIGS. 11A, 11B and 11C).

Following the above, the hard mask film 42 and BSG film 41 are removed. Further, the polysilicon layer 38 is entirely oxidized (not shown). The silicon substrate 11 is then subjected to thermal oxidation at, e.g. about 1100° C., and an oxide film (not shown) is formed within the trench 46. In addition, a silicon nitride film (not shown) is formed in the trench 46, and the silicon nitride film at the upper part of the trench 46 is removed. Then, again, a collar insulating film 47 is selectively formed by, e.g. thermal oxidation, on only that part where the silicon nitride film has been removed. The final thickness of the collar insulating film 47 is, e.g. about 25 nm to 30 nm. Through this step, the thickness of the collar insulating film 47 can desirably be controlled (FIGS. 12A, 12B and 12C).

Figure 13A:
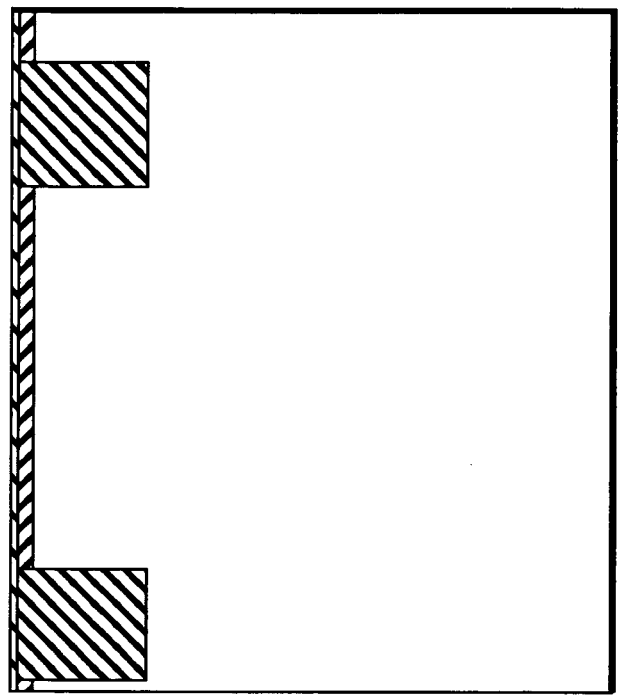
Figure 13B:
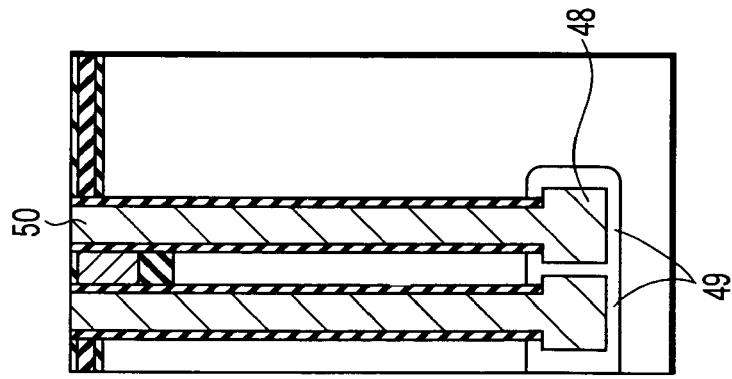
Figure 13C:
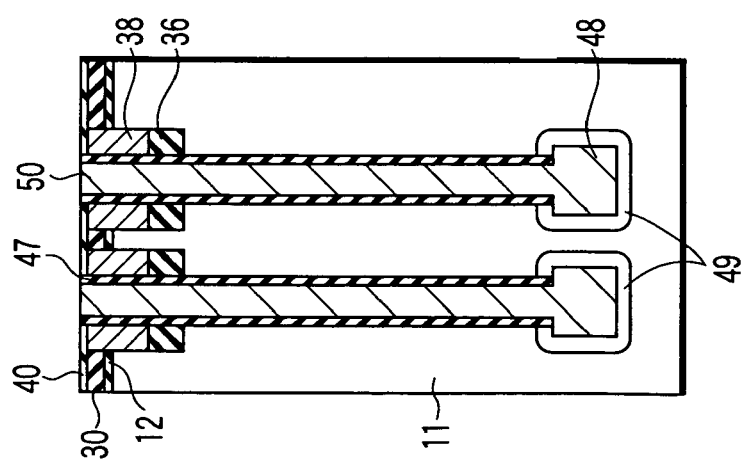

A bottom portion 48 of the deep trench 46 is etched by about 30 nm by, e.g. chemical dry etching, and thus enlarged. Further, arsenic (As) or phosphorus (P) is adsorbed or diffused in the deep trench 46 by a gas-phase reaction, and an N$^+$ diffusion region 49 (plate electrode) is formed in the silicon substrate 11. Subsequently, a capacitor insulating film (not shown) is formed along the inner wall of the bottom portion 48 of the deep trench 46, and a polysilicon layer (storage electrode) 50 is buried in the deep trench 46. Thereafter, the top surface is flattened by, e.g. CMP (FIGS. 13A, 13B and 13C).

Figure 14C:
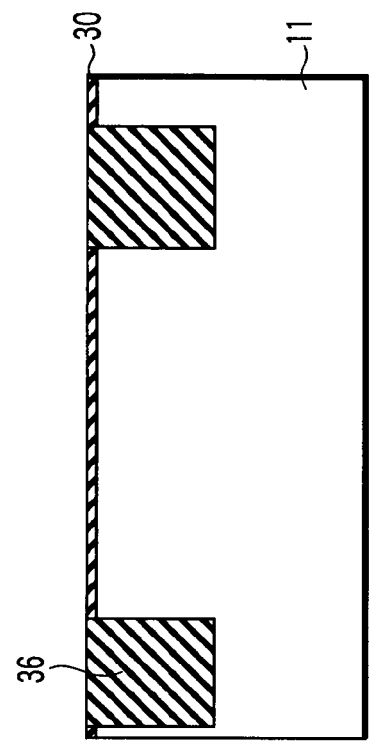
Figure 14B:
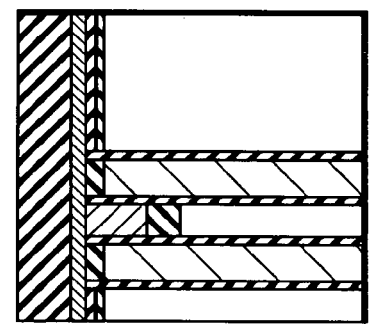
Figure 14A:
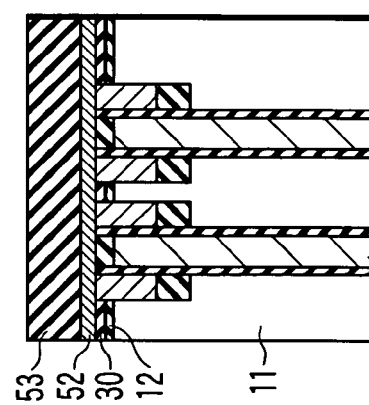

Next, the polysilicon layer 50 is etched back by about 50 nm by, e.g. a wet etching method. In the etched-back recess, a buried insulating film 51 of TEOS-SiO$_2$ is deposited by 200 nm by CVD using, e.g. TEOS as a reaction gas. Then, part of the buried insulating film 51 and silicon nitride film 40 are removed by, e.g. CMP, and the surface of the resultant structure is polished until the upper surface of the polysilicon layer 38 will be exposed (FIGS. 14A, 14B and 14C).

An undoped polysilicon layer 52 with a thickness of about 70 nm is deposited over the entire surface. Boron (B), for instance, is doped in the polysilicon layer 52 by ion implantation under conditions of 5 keV with $2 \times 10^{15}/\text{cm}^3$. Further, a BSG film 53 with a thickness of about 150 nm serving as a cap layer is deposited on the polysilicon layer 52. Then, only the area of the memory cell area is masked (FIGS. 14A and 14B).

The polysilicon layer 52 and BSG film 53 in the peripheral circuit region are removed by etching. Channel ion implantation is performed to form a channel region (not shown). In this case, the implanted impurities are thermally spread by annealing (FIG. 14C).

Figure 15C:
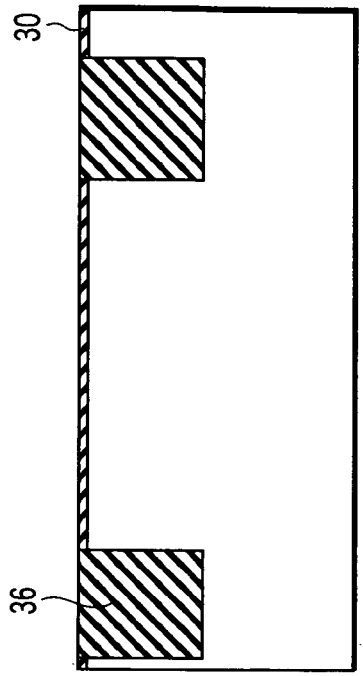
Figure 15B:
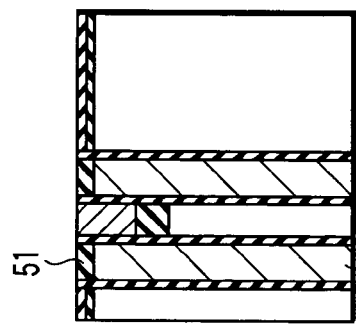
Figure 15A:
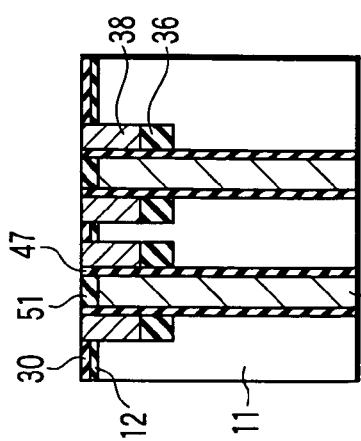
Figure 16A:
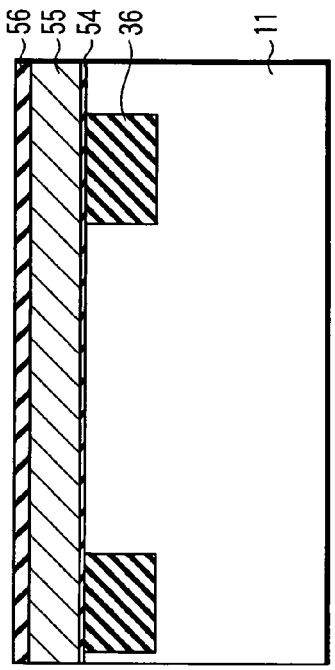
Figure 16B:
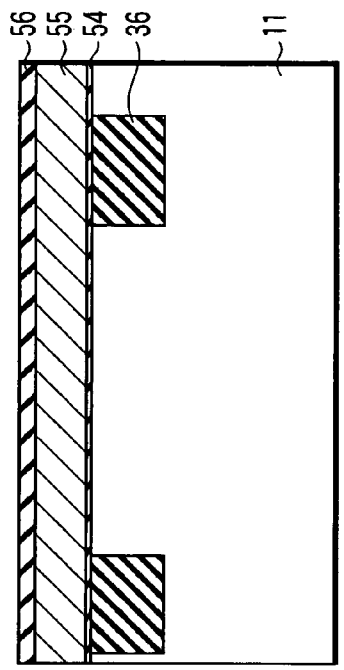
Figure 16C:
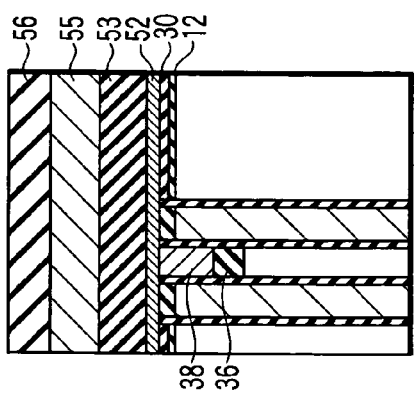

The surface of the substrate 11 is then thermally oxidized to form a gate insulating film 54. A polysilicon layer 55 with a thickness of about 200 nm, which becomes a gate electrode of the peripheral circuit, is formed on the gate insulating film 54. A BSG film 56 with a thickness of about 100 nm, which becomes a cap material, is formed on the polysilicon layer 55 (FIGS. 15A, 15B and 15C).

Figure 17A:
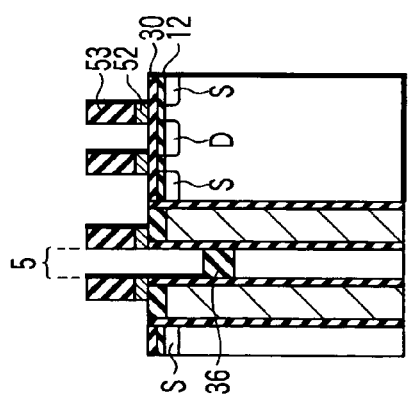
Figure 17B:
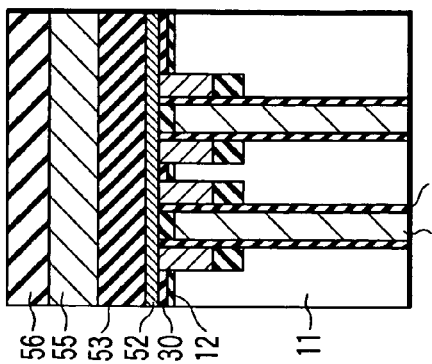

After the polysilicon layer 55 and BSG film 56 of the memory cell array are removed, an upper part of the gate electrode of the transistor in the memory cell and the word line WL are formed. In this case, a photoresist is first coated on the BSG film 56, and the photoresist is subjected to exposure and development to form a desired pattern. Using the photoresist as a mask, the polysilicon layer 52, BSG film 53 and polysilicon layer 38 are etched by, e.g. RIE. The device isolation region 5, from which the polysilicon layer 38 has been removed, functions to separate the trench capacitors TC that are adjacent along the bit line BL. Specifically, as shown in FIG. 17B, the device isolation region 5 is a device isolation region between the trench capacitor TC<00> and trench capacitor TC<03>. At this time, in the manufacturing step of this embodiment, the regions that become the gate electrode, bit line contact BC and device isolation region 5 are formed at a time. Since line-and-space photoresist patterns can be used, the manufacturing cost can be reduced and a higher integration density can be achieved.

Figure 17C:
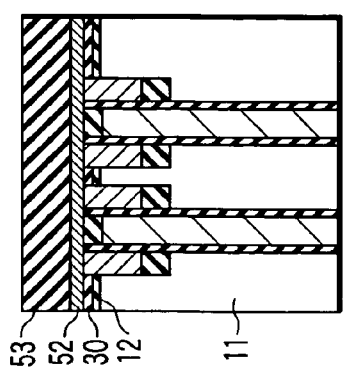

Thereafter, impurity ions of a conductivity type opposite to the conductivity type of the silicon substrate 11, e.g. phosphorus (P) or arsenic (As), are ion-implanted and diffused by annealing. Thus, the source region S and drain region D of the transistor TR are formed (FIGS. 17A, 17B and 17C).

A silicon nitride film 59 that becomes a spacer is deposited on the entire surface, and it is etched by, e.g. RIE. As a result, there remain only the polysilicon layer 55, which is to become the gate electrode of transistor TR, the spacer silicon nitride film 59 lying on the side wall of the BSG film 56, and the underlying silicon nitride film 30. Further, a barrier silicon nitride film 60 is deposited on the entire surface. A BPSG film 61 is deposited on the device isolation region 5 between the trench capacitors TC that are adjacent along the bit line BL (FIGS. 18A and 18B).

Similar steps are performed for the peripheral circuit. As a result, only the barrier silicon nitride film 60 is left on the BSG film 56 (FIG. 18C).

Subsequently, parts of the barrier silicon nitride film 60, BPSG film 61 and buried insulating film 51 are removed by, e.g. RIE. With the partial removal of the buried insulating film 51, a conduction path is formed between the node electrode of the trench capacitor TC and the strap electrode that is to be formed later (FIGS. 19A and 19B).

A similar step is carried out for the peripheral circuit, and the barrier silicon nitride film 60 is removed by the RIE step (FIG. 19C).

A doped polysilicon layer 63 is deposited over the entire surface by, e.g. LPCVD (Low Pressure Chemical Vapor Deposition). With this step, the strap electrode ST, which electrically connects the source electrode of the memory cell MC and one of the electrodes of the trench capacitor TC, and the bit line contact BC, are formed. Further, the polysilicon layer 63 is also deposited on the device isolation region 5 that separates the trench capacitors TC arranged adjacent along the bit line BL (FIGS. 20A, 20B and 20C).

Next, a gate structure of the peripheral circuit is formed. The BSG film 56 and polysilicon layer 55 are patterned by, e.g. RIE, thereby forming a gate electrode structure. Using the gate electrode structure as a mask, impurities are introduced in the substrate 11 and low-concentration impurity-diffused regions 57 are formed. Subsequently, a silicon oxide film, for instance, is deposited and then etched back by, e.g. RIE, so that portions thereof may remain on the side walls of the gate electrode structure. Thus, a spacer 64 is formed (FIG. 21C). This step is performed, with the memory cell side being masked (FIGS. 21A and 21B).

The BSG film 53 formed on the polysilicon layer 52, which becomes the gate electrode of the transistor TR, and the BSG film 56 formed on the gate electrode 55 of the transistor of the peripheral circuit, are removed (FIGS. 22A and 22B).

Using the gate electrode with the spacer 64 as a mask, ion implantation is performed to form high-concentration impurity regions 58. Thus, the source and drain regions of the peripheral circuit are completely formed (FIG. 22C).

Next, through salicide processes, the polysilicon layer 52 that becomes the word line WL and a high-melting-point metal layer are reacted to form a silicide layer 52S, and the polysilicon layer 63 and a high-melting-point metal layer are reacted to form a silicide layer 63S. By reacting the gate electrode 55 and a high-melting-point metal layer, a silicide layer 55S is formed. Similarly, the substrate 11 on the source and drain regions and a high-melting-point metal layer are reacted to form a silicide layer 64. In this way, the surface of each polysilicon layer is silicided, thereby reducing the wiring resistance (FIGS. 23A, 23B and 23C).

Figure 24A:
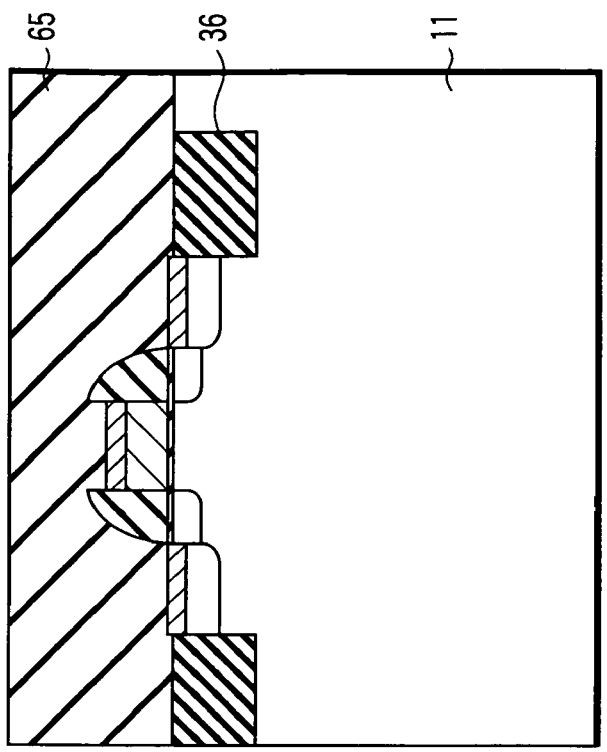
Figure 24B:
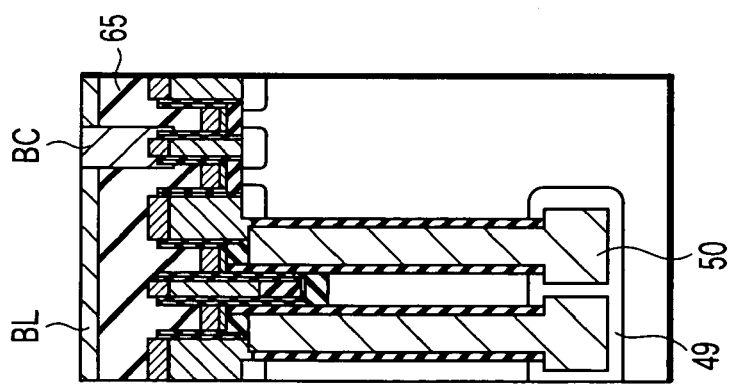
Figure 24C:
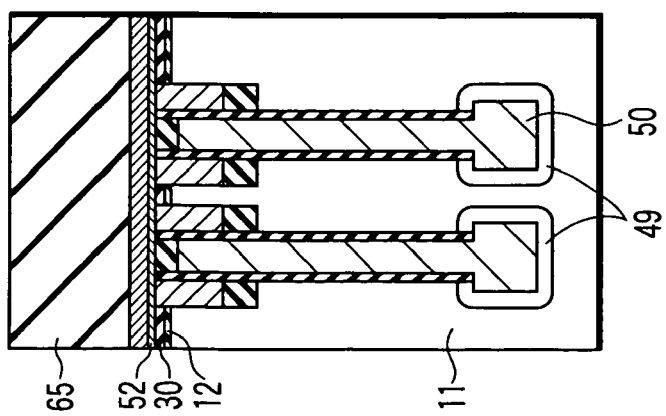

A silicon nitride film 65 is deposited on the entire surface. Through-holes that penetrate the silicon nitride film 65 are formed by, e.g. RIE. By forming buried plugs in the through-holes, a bit line contact BC<11> and source and drain contacts for the transistor of the peripheral circuit can be formed. Further, the bit line BL<1> is formed in the silicon nitride film 65 (FIGS. 24A, 24B and 24C).

Through the above-described steps, the DRAM as shown in FIGS. 1A to 1D is obtained.

The fabrication method of this embodiment has the following advantages.

The pillar FIN for forming the fin-gate type double-gate transistor is first formed, following which the trench capacitors TC are formed. Thus, as shown in FIGS. 14A and 14B, the polysilicon layer 50 can be etched sufficiently deep, by controlling the depth, time and temperature for etching the polysilicon layer 50. The depth of the etching is equal to the thickness of the buried insulating film 51 to be formed later. As mentioned above, the thickness of the buried insulating film 51 is important for electrical insulation from the word line WL. According to the present fabrication method, the thickness of the buried insulating film 51 can be freely set, as desired.

As is shown in FIGS. 17A and 17B, the regions that become the gate electrode, bit line contact BC and device isolation region 5 can be formed at a time. In other words, since the line-and-space photoresist pattern can be used, the manufacturing cost can be reduced and a higher integration density can be achieved.

Moreover, as shown in FIGS. 22A, 22B and 22C, the word line WL, strap electrode ST, bit line contact BC and peripheral circuit can be silicided at the same time. Thus, the fabrication steps can be simplified and the manufacturing cost can be reduced.

The etching rate of the silicon nitride film 30 is lower than that of the gate electrode 38. Therefore, the gate electrode 38 can be protected at the time of etching.

The buried insulating film 51 can easily be formed, as described above. Therefore, the cost for forming it does not increase.

Since the strap electrode ST is provided, ions are implanted deeper in the pillar FIN and the pillar FIN is not damaged. If the strap electrode ST is not used for connection, it is necessary to directly connect the source region and the trench capacitor TC. In this case, the diffusion region that becomes the source region needs to be formed deeper in the pillar FIN by ion-implantation. Consequently, the pillar FIN may be damaged in the ion-implantation step.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   a projecting semiconductor layer formed on a major surface of a semiconductor substrate;
   a channel region of a first conductivity type formed in part of the projecting semiconductor layer;
   source and drain regions of a second conductivity type formed in the projecting semiconductor layer such that the source and drain regions sandwich the channel region;
   a pair of first insulating films formed on a surface of the channel region on opposed side walls of the semiconductor layer;
   a pair of gate electrodes formed on a surface of the pair of first insulating films on the opposed side walls of the semiconductor layer;
   a first trench capacitor provided near the source region in the semiconductor layer, the first trench capacitor having one electrode electrically connected to the source region; and
   a second insulating film having a greater thickness than the first insulating films, and provided between surfaces of the pair of gate electrodes, which are opposed to the surfaces on which the first insulating films are formed, and a second trench capacitor formed adjacent to the first trench capacitor.

2. The semiconductor memory device according to claim 1, further comprising:
   a strap electrode provided on at least one of an upper surface and a side wall of the semiconductor layer, and electrically connecting the source region and one of the electrodes of the first trench capacitor; and
   a third insulating film interposed at a part between the source region and the strap electrode.

3. The semiconductor memory device according to claim 1, further comprising:
   a fourth insulating film formed on an upper part of the first trench capacitor;
   a fifth insulating film formed on the semiconductor layer and interposed between the pair of gate electrodes;
   a first word line formed on the fourth insulating film and electrically connected to the pair of gate electrodes; and
   a second word line formed on the fifth insulating film and electrically connected to the pair of gate electrodes.

4. The semiconductor memory device according to claim 3, wherein the fourth insulating film is thicker than the first insulating film.

5. The semiconductor memory device according to claim 1, further comprising:
   a bit line electrically connected to the drain region via a connection portion; and
   an isolation portion provided between the first trench capacitors and third trench capacitors, which are formed adjacent to the first trench capacitors along a bit line direction, the isolation portion having substantially the same structure as the connection portion.

6. The semiconductor memory device according to claim 1, wherein the pair of gate electrodes have a stacked structure comprising a polysilicon layer and a silicide layer.

7. The semiconductor memory device according to claim 1, further comprising a sixth insulating film provided on an upper part of the semiconductor layer and formed of a material with a high etching selectivity ratio for a material of the pair of gate electrodes.

* * * * *